US012575041B2

(12) United States Patent
Wang

(10) Patent No.: US 12,575,041 B2
(45) Date of Patent: Mar. 10, 2026

(54) DISPLAY MODULE

(71) Applicant: WUHAN CHINA STAR OPTOELECTRONICS SEMICONDUCTOR DISPLAY TECHNOLOGY CO., LTD., Wuhan (CN)

(72) Inventor: Wenqiang Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 251 days.

(21) Appl. No.: 18/034,240

(22) PCT Filed: Mar. 27, 2023

(86) PCT No.: PCT/CN2023/084088
§ 371 (c)(1),
(2) Date: Apr. 27, 2023

(87) PCT Pub. No.: WO2024/174332
PCT Pub. Date: Aug. 29, 2024

(65) Prior Publication Data
US 2025/0081366 A1 Mar. 6, 2025

(30) Foreign Application Priority Data
Feb. 24, 2023 (CN) .......................... 202310180387.2

(51) Int. Cl.
*H05K 5/02* (2006.01)
*H05K 5/00* (2025.01)
(52) U.S. Cl.
CPC ......... *H05K 5/0217* (2013.01); *H05K 5/0018* (2022.08)

(58) Field of Classification Search
CPC ....... G06F 1/1652; G09F 9/301; B32B 3/266; B32B 3/30
See application file for complete search history.

(56) References Cited

U.S. PATENT DOCUMENTS

2020/0163233 A1 5/2020 Brackley et al.
2020/0171784 A1* 6/2020 Hamburgen .............. B32B 5/12
(Continued)

FOREIGN PATENT DOCUMENTS

CN 112991959 A 6/2021
CN 113066375 A 7/2021
(Continued)

OTHER PUBLICATIONS

International Search Report in International application No. PCT/CN2023/084088,mailed on Nov. 13, 2023.
(Continued)

*Primary Examiner* — Alicia J Weydemeyer
(74) *Attorney, Agent, or Firm* — PV IP PC; Christopher S. Ruprecht; Wei Te Chung

(57) ABSTRACT

The present disclosure provides a display module, including a first support element and a second support element respectively located in a first non-bending region and a second non-bending region of the display module, and a third support element located in a bending region of the display module. A density of the third support element is greater than that of the first support element and the second support element. The present disclosure integrates two materials with different densities. The first support element and the second support element are made of materials with lower densities, thereby reducing the weight of the display module.

20 Claims, 10 Drawing Sheets

(56)                    References Cited

U.S. PATENT DOCUMENTS

| | | | | |
|---|---|---|---|---|
| 2020/0342202 A1* | 10/2020 | Bae | ........................ | G06F 1/3218 |
| 2022/0312604 A1* | 9/2022 | Feng | ........................ | B32B 15/09 |

FOREIGN PATENT DOCUMENTS

| | | | | |
|---|---|---|---|---|
| CN | 114005362 A | | 2/2022 |
| CN | 114283700 A | | 4/2022 |
| CN | 114664180 A | | 6/2022 |
| CN | 114694512 A | | 7/2022 |
| CN | 115116338 A | | 9/2022 |
| CN | 115394197 A | | 11/2022 |
| CN | 217902635 U | | 11/2022 |
| CN | 115662297 A | | 1/2023 |
| KR | 20190053367 A | * | 5/2019 |
| WO | 2021201575 A1 | | 10/2021 |

OTHER PUBLICATIONS

Written Opinion of the International Search Authority in International application No. PCT/CN2023/084088,mailed on Nov. 13, 2023.
Chinese Office Action issued in corresponding Chinese Patent Application No. 202310180387.2 dated Jan. 19, 2026, pp. 1-11.

* cited by examiner

10

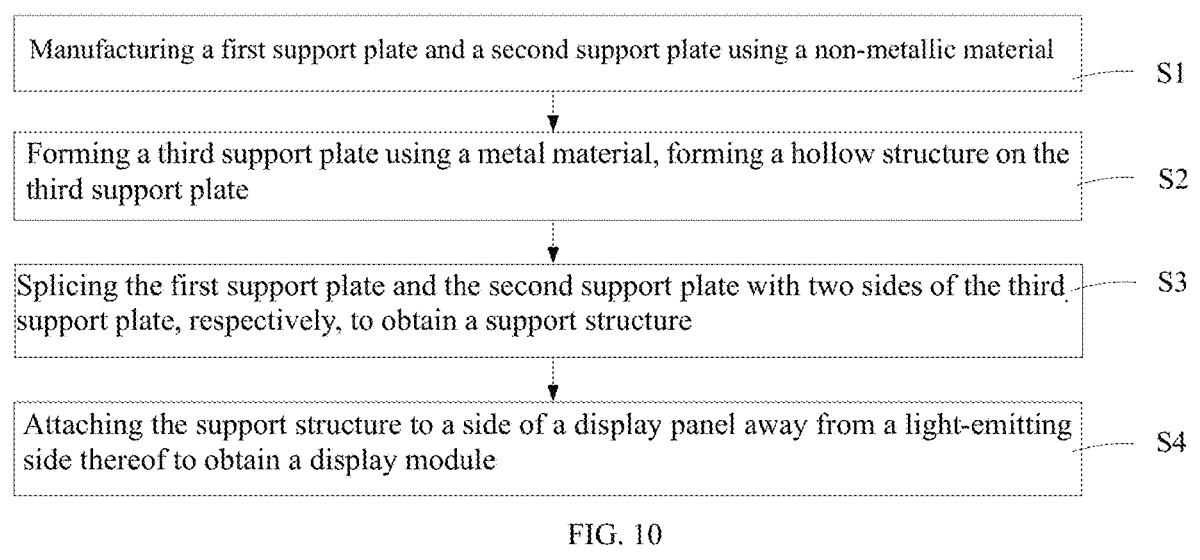

Manufacturing a first support plate and a second support plate using a non-metallic material ---- S1

Forming a third support plate using a metal material, forming a hollow structure on the third support plate ---- S2

Splicing the first support plate and the second support plate with two sides of the third support plate, respectively, to obtain a support structure ---- S3

Attaching the support structure to a side of a display panel away from a light-emitting side thereof to obtain a display module ---- S4

FIG. 10

DISPLAY MODULE

TECHNICAL FIELD

The present disclosure relates to the field of bendable display devices, and in particular, to a display module.

BACKGROUND

Bendable mobile phones realize consumption demand of miniaturization of the overall size of the mobile phones and large-screen display, and have attracted the interest of a large number of consumers. The flexible folding screen, as a display body, is one of the important components of the folding mobile phone. The weight of a display module of the organic light-emitting diode (OLED) folding screen is mainly concentrated on the support layer thereof. Generally, in order to improve the support and flatness of the OLED folding screen display module, a metal plate is used as a support layer, for example, stainless steel, titanium alloy, copper alloy, and the like. Since the metal material has a high density, the overall weight of the display module of the OLED folding screen is heavy. In addition, if the support layer is directly made of a material such as carbon fiber and titanium alloy or the like, the price of the support layer of the display module cannot be effectively reduced because the cost of the raw material thereof is too high.

In terms of structure and function, the display module of the OLED folding screen is divided into a bending region and a non-bending region. In order to improve the bending performance of the bending region, a hollowed-out through-hole structure is generally formed in the bending region. In this case, the through-hole structure of the bending region is therefore required to have sufficient strength. In order to improve the processing efficiency and cost, the through-hole structure is often formed by a chemical etching process, which can achieve a batch production, thereby reducing the overall processing cost. However, non-metallic materials such as carbon fiber and glass fiber are required to be treated by laser to form the hollowed-out structure in the bending region, resulting in expensive processing cost, and low processing efficiency. Therefore, the overall cost of the device is relatively high, and the batch production cannot be performed.

SUMMARY

Technical Problem

In view of this, the present disclosure provides a display module having a low overall weight.

Technical Solutions

To solve the above problem, the present disclosure provides the following technical solutions:

The present disclosure provides a display module including a display panel and a support structure formed on a side of the display panel away from a light-emitting side of the display panel, wherein the display panel is a bendable display panel and includes a bending region, a first non-bending region, and a second non-bending region, and the bending region is located between the first non-bending region and the second non-bending region; the support structure includes a combined support layer including:

a first support element located in the first non-bending region;

a second support element located in the second non-bending region; and a third support element located between the first support element and the second support element and located in the bending region, wherein the third support element is connected to the first support element and the second support element and has a hollowed-out structure;

wherein densities of the first support element and the second support element are less than a density of the third support element.

In an alternative embodiment of the present disclosure, a first splicing seam is formed between the first support element and the third support element, and located in the first non-bending region; and a second splicing seam is formed between the second support element and the third support element, and located in the second non-bending region.

In an alternative embodiment of the present disclosure, the first splicing seam and the second splicing seam are filled with a thermoplastic material, so that surfaces of the first support element, the second support element, and the third support element are flush with surfaces of the first splicing seam and the second splicing seam.

In an alternative embodiment of the present disclosure, the support structure further includes a planarization layer, which is formed on a side of the combined support layer close to the display panel and covers the surface of the thermoplastic material in the first splicing seam and the second splicing seam.

In an alternative embodiment of the present disclosure, an orthographic projection of the planarization layer on the combined support layer is disposed outside the hollowed-out structure.

In an alternative embodiment of the present disclosure, the support structure further includes a protective layer, which is formed on a surface of the combined support layer away from the planarization layer and covers the first splicing seam, the second splicing seam, and the hollowed-out structure.

In an alternative embodiment of the present disclosure, the third support element is made of metal, and the first support element and the second support element are made of non-metal.

In an alternative embodiment of the present disclosure, at the first splicing seam and the second splicing seam, a side of the first support element close to the third support element and a side of the second support element close to the third support element have a first joining portion, respectively, opposite sides of the third support element have a second joining portion, respectively, and the first joining portion is inserted to and spliced in a staggered manner with the second joining portion.

In an alternative embodiment of the present disclosure, the first joining portion includes a plurality of first convex portions and first receiving grooves, and each of the first receiving grooves is formed between any adjacent two of the first convex portions; the second joining portion includes a plurality of second convex portions and second receiving grooves, and each of the second receiving grooves is formed between any adjacent two of the second convex portions; the first convex portions are received in the second receiving grooves, and the second convex portions are received in the first receiving grooves.

In an alternative embodiment of the present disclosure, the first joining portion and the second joining portion have a shape selected from at least one of a wavy shape, a trapezoidal shape, a rectangular shape, and a sawtooth shape.

In an alternative embodiment of the present disclosure, at the first splicing seam and the second splicing seam, the first support element and the second support element are independently spliced with the third support element using concave-convex butt-insertion structures.

In an alternative embodiment of the present disclosure, each of the concave-convex butt-insertion structures includes a concave structure and a convex structure, one of the concave structure and the convex structure is located on the first support element or the second support element, and the other of the concave structure and the convex structure is located on the third support element; the concave structure is recessed from a surface of one of the first joining portion and the second joining portion toward an inside thereof, the convex structure extends outwardly from a surface of the other of the first joining portion and the second joining portion, and the concave structure is bonded to the convex structure by an adhesive layer.

In an alternative embodiment of the present disclosure, a fingerprint sensor hole is disposed on the first support element or the second support element and filled with a transparent resin, and a surface of the transparent resin is flush with a surface of the first support element or the second support element around the fingerprint sensor hole.

In an alternative embodiment of the present disclosure, the first support element and the second support element are made of at least one of glass fibers, carbon fibers, and polymeric materials.

In an alternative embodiment of the present disclosure, the first support element and the second support element are made of glass fibers or carbon fibers; and each of the first support element and the second support element comprises $N+1$ first fiber layers, $N$ second fiber layers and $N+1$ resin layers, the first fiber layers and the second fiber layers are alternately arranged, the resin layers are located on the first fiber layers and surround the second fiber layers, and an included angle between an extension direction of fibers in the first fiber layers and an extension direction of fibers in the second fiber layers is greater than $0°$ and less than $180°$, $N$ is a positive integer greater than 1.

In an alternative embodiment of the present disclosure, the display panel includes a display screen, a back plate and an optical adhesive layer, the back plate is located on a back side of the display screen, the optical adhesive layer is located between the back plate and the support structure, and the optical adhesive layer adheres to the planarization layer of the support structure.

In an alternative embodiment of the present disclosure, the optical adhesive layer includes a first adhesive segment and a second adhesive segment, the first adhesive segment and the second adhesive segment are located in the first non-bending region and the second non-bending region, respectively.

In an alternative embodiment of the present disclosure, the planarization layer includes a first planarization layer and a second planarization layer, the first planarization layer is located in the first non-bending region, the second planarization layer is located in the second non-bending region, an orthographic projection of the first adhesive segment on the combined support layer is within an orthographic projection of the first planarization layer on the combined support layer.

In an alternative embodiment of the present disclosure, the first adhesive segment and the second adhesive segment extend from the first non-bending region and the second non-bending region to the bending region, respectively; and extension lengths of the first adhesive segment and the second adhesive segment in the bending region are 1 mm-2 mm.

In an alternative embodiment of the present disclosure, the third support element is integrally formed with the first support element and the second support element.

Beneficial Effect

According to the display module provided by the present disclosure, two materials with different densities are used to form the combined support layer, and the density of the third support element is larger than that of the first support element and the second support element, the first support element and the second support element are respectively located in the first non-bending region and the second non-bending region of the display module, and the third support element is located in the bending region of the display module. The present disclosure integrates two materials with different densities, and the first support element and the second support element made of materials with lower densities can reduce the weight of the display module.

BRIEF DESCRIPTION OF THE DRAWINGS

In order to illustrate technical solutions in the embodiments of the present disclosure more clearly, the accompanying drawings which are to be used in the description of the embodiments will be described. It will be apparent that the accompanying drawings in the description are merely some of the embodiments of the present disclosure, and other drawings may be made to those skilled in the art without involving any inventive effort.

FIG. 10 is a flow chart of a method of manufacturing a support structure according to the present disclosure.

DETAILED DESCRIPTION OF EMBODIMENTS OF THE INVENTION

Figure 1:
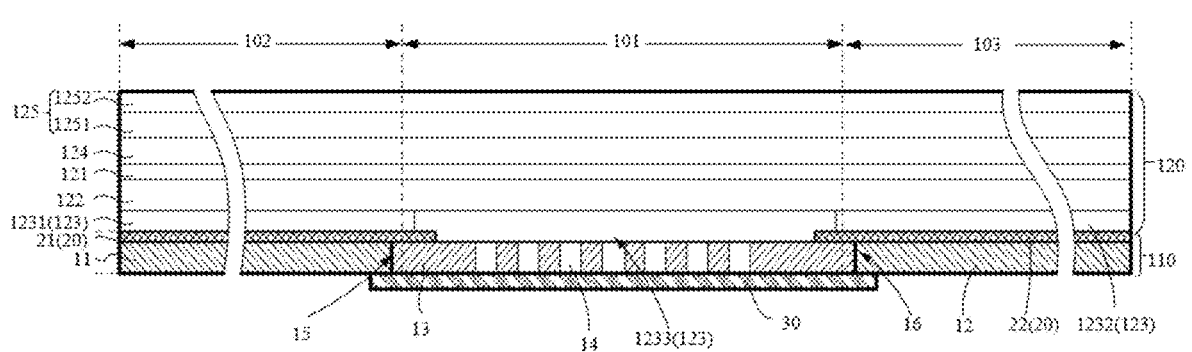
FIG. 1 is a cross-sectional view of a display module according to a first embodiment of the present disclosure.

Technical solutions in the embodiments of the present disclosure will be described fully and completely with reference to the accompanying drawings. It is apparent that the described embodiments are only part of the embodiments of the present disclosure, rather than all embodiments. Based on the embodiments in the present disclosure, all other embodiments obtained by a person skilled in the art without involving any inventive effort are within the scope of the present disclosure.

In the description of the present disclosure, it is to be understood that the terms "upper", "lower", and the like indicating azimuth or positional relationships are based on the azimuth or positional relationships shown in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include one or more features. In the description of the present disclosure, the meaning of "a plurality of" is to indicate two or more, unless otherwise specifically defined.

Reference numerals and/or reference letters may be repeated in different implementations, and such repetition is for purposes of simplicity and clarity, without indicating the relationship between the various embodiments and/or arrangements discussed.

The support structure and display module according to the present disclosure will be described in detail below in connection with specific embodiments and the accompanying drawings.

Referring to FIG. 1, a first embodiment of the present disclosure provides a display module 100, including a support structure 110 and a display panel 120. The support structure 110 is disposed on the display panel 120. Specifically, the support structure 110 is disposed at a side of the display panel 120 away from a light-emitting side thereof.

The display panel 120 includes a bending region 101, a first non-bending region 102, and a second non-bending region 103. The bending region 101 is located between the first non-bending region 102 and the second non-bending region 103.

The support structure 110 includes a combined support layer 10. The combined support layer 10 includes a first support element 11, a second support element 12, and a third support element 13. The first support element 11 is located in the first non-bending region 102, the second support element 12 is located in the second non-bending region 103, and the third support element 13 is located between the first support element 11 and the second support element 12, and located in the bending region 101. The third support element 13 is connected to the first support element 11 and the second support element 12. A hollowed-out structure 14 is formed on the third support element 13. Densities of the first support element 11 and the second support element 12 are less than a density of the third support element 13, respectively.

In the support structure 110 and the display module 100 according to the present disclosure, the combined support layer 10 is formed of two materials with different densities, and the density of the third support element 13 is larger than the density of the first support element 11 and the density of the second support element 12. The first support element 11 and the second support element 12 are respectively located in the first non-bending region 102 and the second non-bending region 103 of the display module 100, and the third support element 13 is located in the bending region 101 of the display module 100. In the present disclosure, two materials of different densities are integrated with each other, and the first support element 11 and the second support element 12 are made of a material having a lower density, so that a weight of the display module can be reduced.

The third support element 13 is made of metal, and the first support element 11 and the second support element 12 are made of non-metal. As thus, the hollowed-out structure 14 of the support structure 110 according to the present disclosure is formed in the third support element 13 made of the metal material with a relatively high density, rather than the first support element 11 and the second support element 12 made of the non-metal material with a relatively low density, so that the hollowed-out structure 14 may be formed by a chemical etching process, without the need to perform laser processing in the bending region 101 to achieve a hollowed-out design thereof, thereby reducing the processing cost of the hollowed-out structure 14 and improving the processing efficiency, and in turn reducing the manufacturing cost of the display module 100.

The third support element 13 is spliced with the first support element 11 and the second support element 12 at two sides of the third support element. A first splicing seam 15 is formed between the first support element 11 and the third support element 13, and located in the first non-bending region 102. A second splicing seam 16 is formed between the second support element 12 and the third support element 13, and located in the second non-bending region 103.

The first splicing seam 15 and the second splicing seam 16 are filled with a thermoplastic material, so that surfaces of the first support element 11, the second support element 12 and the third support element 13 are flush with the surface of the thermoplastic material in the first splicing seam 15 and the second splicing seam 16.

The first splicing seam 15 (which is located between the first support element 11 and the third support element 13) and the second splicing seam 16 (which is located between the second support element 12 and the third support element 13) are disposed in the first non-bending region 102 and the second non-bending region 103 (that is, positions outside the bending region 101), respectively, and the first splicing seam 15 and the second splicing seam 16 are flatten using a thermoplastic material such as epoxy resin, so that it is possible to prevent a problem that a bending stress causes the first splicing seam 15 and the second splicing seam 16 to be subjected to forces that could lead to interface cracking.

In an alternative embodiment of the present disclosure, the first support element 11 and the second support element 12 are integrally formed with the third support element 13, respectively. Specifically, the first support element 11 and the second support element 12 are integrally joined to the third support element 13 by a thermoplastic molding process, respectively.

Figure 2:
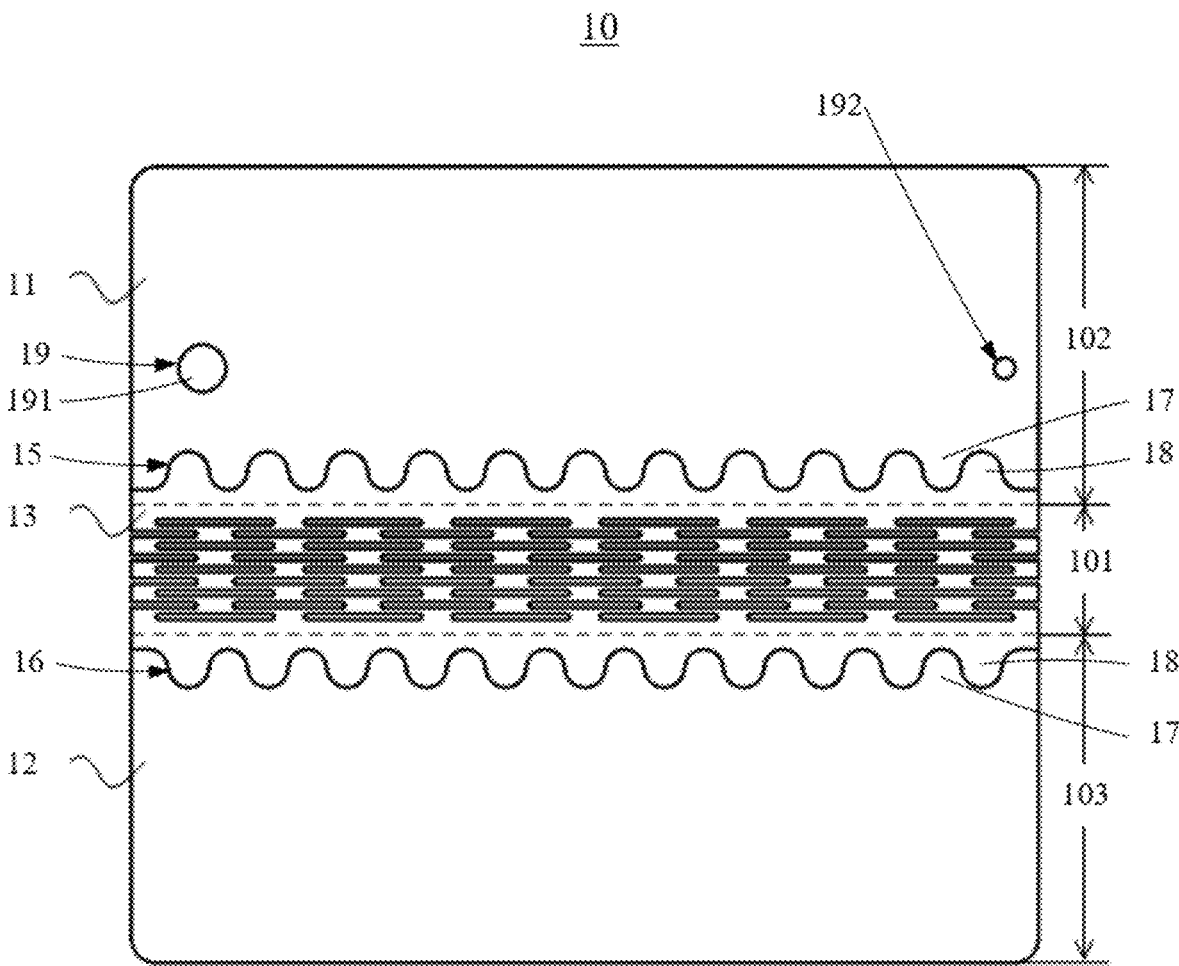
FIG. 2 is a top view of a combined support layer of the display module shown in FIG. 1.
Figure 3:
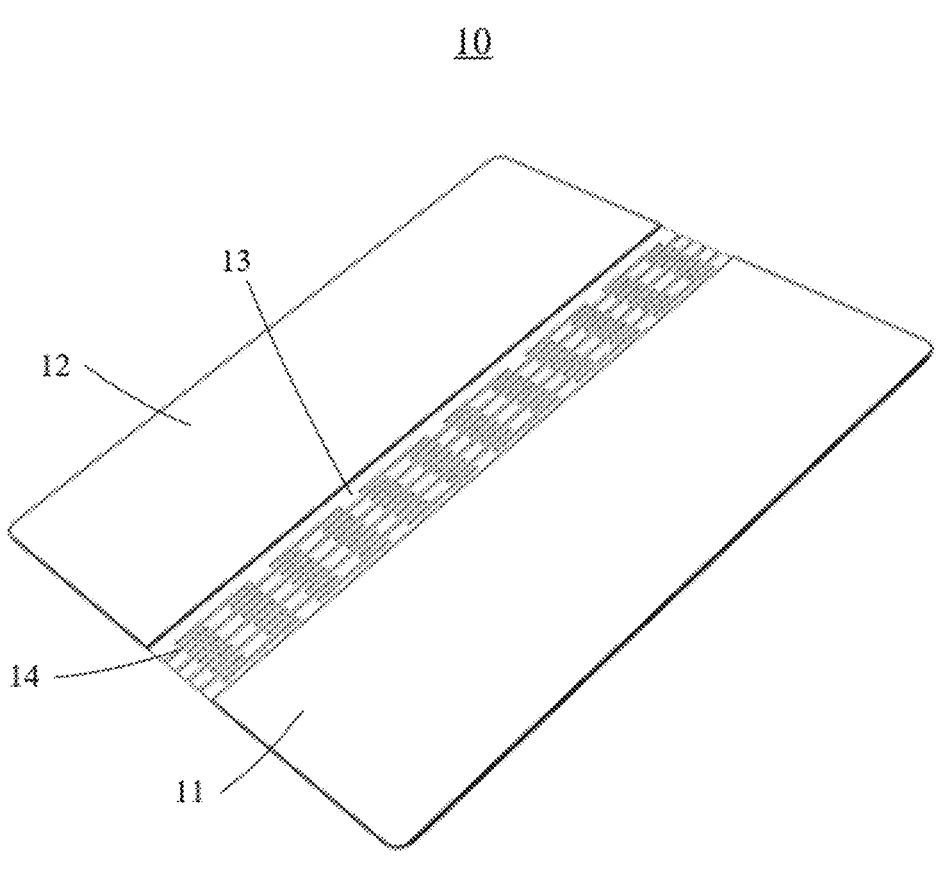
FIG. 3 is a bottom view of the combined support layer shown in FIG. 2.
Figure 4:
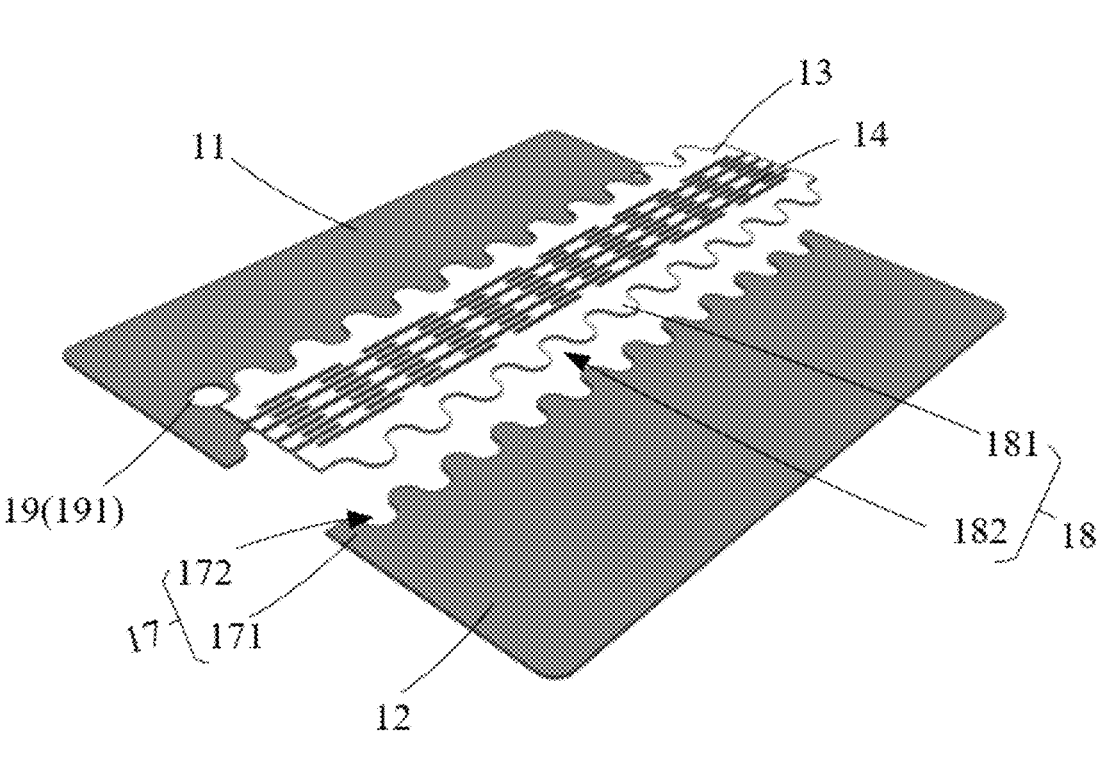
FIG. 4 is a partially exploded view of the combined support layer shown in FIG. 2.

Referring to FIGS. 2 to 4, in an alternative embodiment of the present disclosure, at the first splicing seam 15 and the second splicing seam 16 of the support structure 110, a side of the first support element 11 close to the third support element 13 and a side of the second support element 12 close to the third support element 13 have a first joining portion 17, respectively. Two sides of the third support element 13 have a second joining portion 18, respectively. The first joining portion 17 is inserted to and spliced in a staggered manner with the second joining portion 18.

The first joining portion 17 includes first convex portions 171 and first receiving grooves 172, and each of the first receiving grooves 172 is formed between adjacent two of the first convex portions 171. The second joining portion 18 includes a plurality of second convex portions 181 and second receiving grooves 182, and each of the second receiving grooves 182 is formed between adjacent two of the second convex portions 181. The first convex portions 171 are accommodated in the second receiving grooves 182, and the second convex portions 181 are accommodated in the first receiving grooves 172.

Specifically, referring to FIGS. 2 to 4, in an alternative embodiment of the present disclosure, the first joining portion 17 and the second joining portion 18 have a wave shape, respectively.

Figure 5:
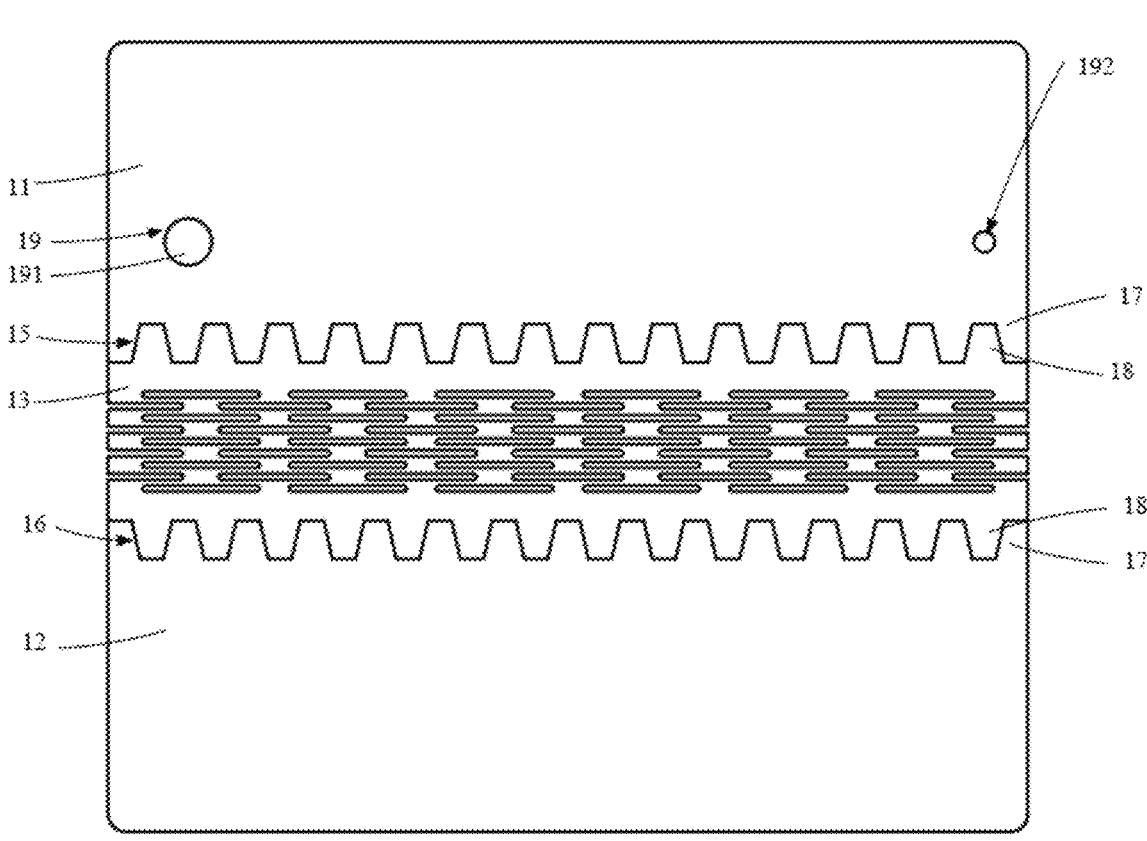
FIG. 5 is a top view of a combined support layer according to another embodiment of the present disclosure.

Specifically, referring to FIG. 5, in an alternative embodiment of the present disclosure, the first joining portion 17 and the second joining portion 18 have a trapezoidal shape, respectively.

Figure 6:
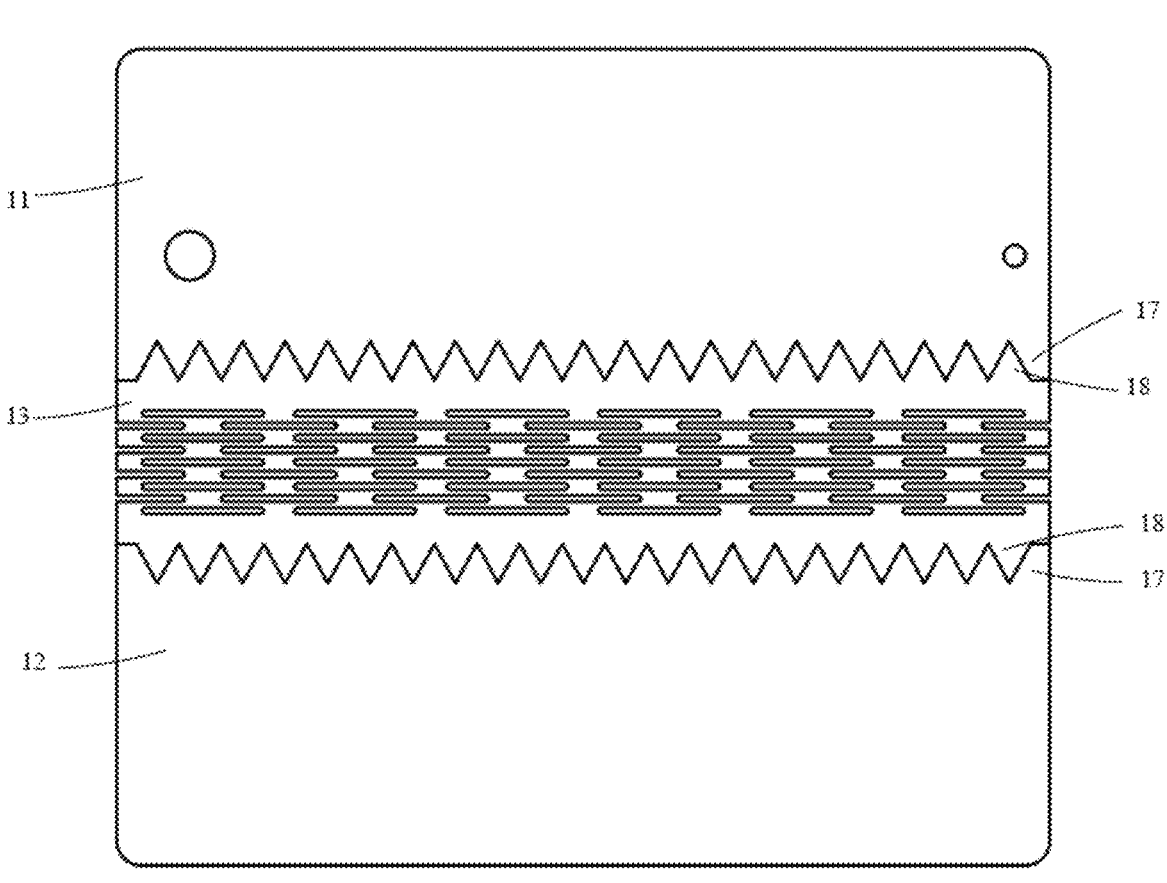
FIG. 6 is a top view of a combined support layer according to still further embodiments of the present disclosure.

Specifically, referring to FIG. 6, in an alternative embodiment of the present disclosure, the first joining portion 17 and the second joining portion 18 have a sawtooth shape, respectively.

Figure 7:
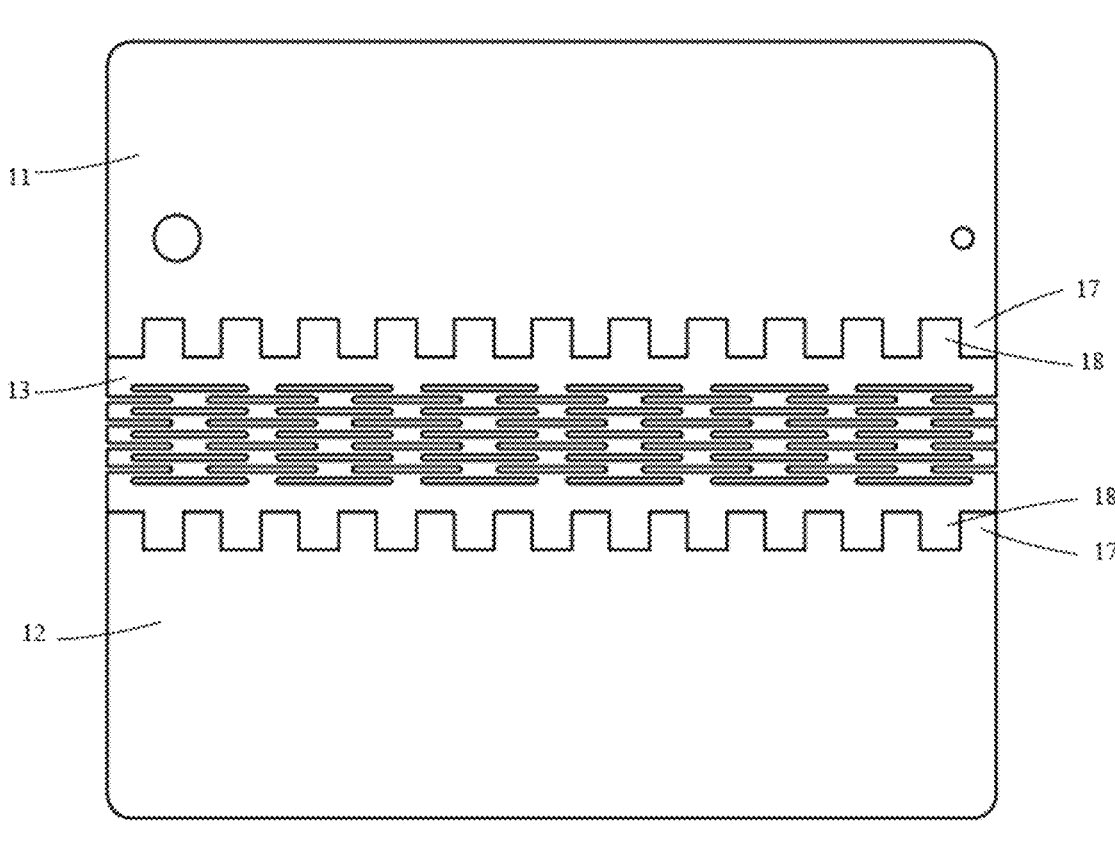
FIG. 7 is a top view of a combined support layer according to another embodiment of the present disclosure.

Specifically, referring to FIG. 7, in an alternative embodiment of the present disclosure, the first joining portion 17 and the second joining portion 18 have a rectangular shape, respectively.

Certainly, in other embodiments, the shape of the first convex portions 171 of the first joining portion 17 and the second convex portions 181 of the second joining portion 18 is not limited to the wave, the trapezoidal, the rectangular and the sawtooth shape, and may be another shape or a combination of at least two of the wave shape, the trapezoidal shape, the rectangular shape, and the sawtooth shape.

The first joining portion 17 and the second joining portion 18 are inserted to and spliced in a staggered manner with each other, so as to increase the binding area of the metal material with the non-metal material at the first joining seam 15 and the second joining seam 16, improve the binding force of the metal material with the non-metal material at the first joining seam 15 and the second joining seam 16, and make the splicing of the metal material and the non-metal material at the first joining seam 15 and the second joining seam 16 more reliable and robust.

In an alternative embodiment of the present disclosure, the first support element 11 and the second support element 12 are made of at least one of glass fibers, carbon fibers, and polymeric materials having light weight and low cost. In an embodiment of the present disclosure, the first support element 11 and the second support element 12 are made of glass fibers.

Referring again to FIG. 1, the support structure 110 further includes a planarization layer 20 and a protective layer 30. The planarization layer 20 and the protective layer 30 are formed on two surfaces of the combined support layer 10, respectively. Specifically, the planarization layer 20 is formed on a side of the combined support layer 10 close to the display panel 120.

The planarization layer 20 is formed by applying and then hardening a common planarization layer material in the industry on the surfaces of the first splicing seam 15 and the second splicing seam 16 in a second thermoplastic molding process. As such, it is possible to reduce the risk of creating imprint due to unevenness of the splicing seams between two different materials when the support structure 110 is attached to other components of the display module 100.

In an alternative embodiment of the present disclosure, the planarization layer 20 covers the first splicing seam 15 and the second splicing seam 16.

In an alternative embodiment of the present disclosure, the planarization layer 20 extends to the bending region 101.

In an alternative embodiment of the present disclosure, an orthographic projection of the planarization layer 20 on the combined support layer 10 is located outside the hollowed-out structure 14.

In an alternative embodiment of the present disclosure, the protective layer 30 covers the first splicing seam 15, the second splicing seam 16, and the hollowed-out structure 14.

Referring to FIG. 2, in an alternative embodiment of the present disclosure, a fingerprint sensor hole 19 is disposed on the first support element 11 or the second support element 12, and filled with a transparent resin 191. A surface of the transparent resin 191 is flush with a surface of the first support element 11 or the second support element 12 around the fingerprint sensor hole 19. In the present embodiment, the fingerprint sensor hole 19 is located on the first support element 11. Accordingly, the display module 100 further includes a fingerprint sensor (not shown), which is positioned correspondingly to the fingerprint sensor hole 19.

The fingerprint sensor hole 19 is disposed on the first or second support element 11 or 12 made of the non-metal material, and filled with the transparent resin 191, so that fingerprint recognition technology can be integrated in a folding screen and the risk of transferring the imprint caused by the height difference of the fingerprint sensor hole 19 to the display module 100 can be reduced.

Referring to FIG. 2, in an alternative embodiment of the present disclosure, an imaging hole 192 is disposed on the first support element 11 or the second support element 12, and filled with a light-transmitting material such as a transparent resin.

Referring again to FIG. 1, in an alternative embodiment of the present disclosure, the support structure 110 is located on the back of the display panel 120.

The display panel 120 includes a display screen 121, a back plate 122, and an optical adhesive layer 123. The back plate 122 is located on the back of the display screen 121, and the optical adhesive layer 123 is located between the back plate 122 and the support structure 110. The optical adhesive layer 123 is bonded to the planarization layer 20.

The optical adhesive layer 123 includes a first adhesive segment 1231 and a second adhesive segment 1232, which are located in the first non-bending region 102 and the second non-bending region 103, respectively. That is, a gap 1233 is disposed between the first adhesive segment 1231 and the second adhesive segment 1232. An orthographic projection of the hollowed-out structure 14 on the optical adhesive layer 123 is within the gap 1233.

The support structure 110 located in the first non-bending region 102 and the second non-bending region 103 is bonded to the display panel 120 (specifically, to the back plate 122) using the segmented optical transparent adhesive, so that the local thickness in the bending region 101 of the display module 100 can be reduced to improve the bending stress of the display module 100 in the bending region 101.

The first adhesive segment 1231 and the second adhesive segment 1232 extend from the first non-bending region 102 and the second non-bending region 103 to the bending region 101, respectively. The lengths of the extended portions of the first adhesive segment 1231 and the second adhesive segment 1232 in the bending region 101 are 1 mm-2 mm. As such, the first adhesive segment 1231 and the second adhesive segment 1232 are prevented from entering the hollowed-out structure 14 in the bending region caused by stress deformation during bending, so as to avoid the stress concentration effect in the hollowed-out structure 14, and in turn avoid tearing of the display module.

In an alternative embodiment of the present disclosure, the planarization layer 20 comprises a first planarization layer 21 and a second planarization layer 22. The first planarization layer 21 is located in the first non-bending region 102, and the second planarization layer 22 is located in the second non-bending region 103. The first planarization layer 21 and the second planarization layer 22 extend from the first non-bending region 102 and the second non-bending region 103 to the bending region 101, respectively. The first planarization layer 21 and the second planarization layer 22 cover the first splicing seam 15 and the second splicing seam 16, respectively.

In an alternative embodiment of the present disclosure, an orthographic projection of the first adhesive segment 1231 on the combined support layer 10 is located within an orthographic projection of the first planarization layer 21 on the combined support layer 10, and an orthographic projection of the second adhesive segment 1232 on the combined support layer 10 is located within an orthographic projection of the second planarization layer 22 on the combined support layer 10.

If the first adhesive segment 1231 and the second adhesive segment 1232 cover the first planarization layer 21 and the second planarization layer 22, respectively, a stress concentration effect may be generated between the ends of the first adhesive segment 1231 and the first planarization layer 21 and between the ends of the second adhesive segment 1232 and the second planarization layer 22. The orthographic projection of the first adhesive segment 1231 on the combined support layer 10 is within the orthographic projection of the first planarization layer 21 on the combined support layer 10, and the orthographic projection of the second adhesive segment 1232 on the combined support layer 10 is within the orthographic projection of the second planarization layer 22 on the combined support layer 10, so that the stress concentration effect can be prevented.

The display panel 120 further includes a polarizer 124 and a cover plate 125. The polarizer 124 is formed on the display screen 121, and the polarizer 124 and the back plate 122 are located on two sides of the display screen 121, respectively. The cover plate 125 is formed on a side of the polarizer 124 away from the display screen 121. In an embodiment, the cover plate 125 includes an ultra-thin glass cover plate 1251 and a protective cover plate 1252. The ultra-thin glass cover plate 1251 is formed on a side of the polarizer 124 away from the display screen 121, and the protective cover plate 1252 is formed on a side of the ultra-thin glass cover plate 1251 away from the polarizer 124. The protective cover plate 1252 is made of a transparent polymeric material and has good optical properties and wear resistance, so as to protect the display screen 121. The optical adhesive layer is made of an adhesive having characteristics such as colorless transparency, good optical transmittance, high binding strength, and low curing shrinkage. The polarizer 124 is a polymeric film layer having characteristics such as high polarization optical properties, high temperature resistance, and high humidity resistance.

Figure 8:
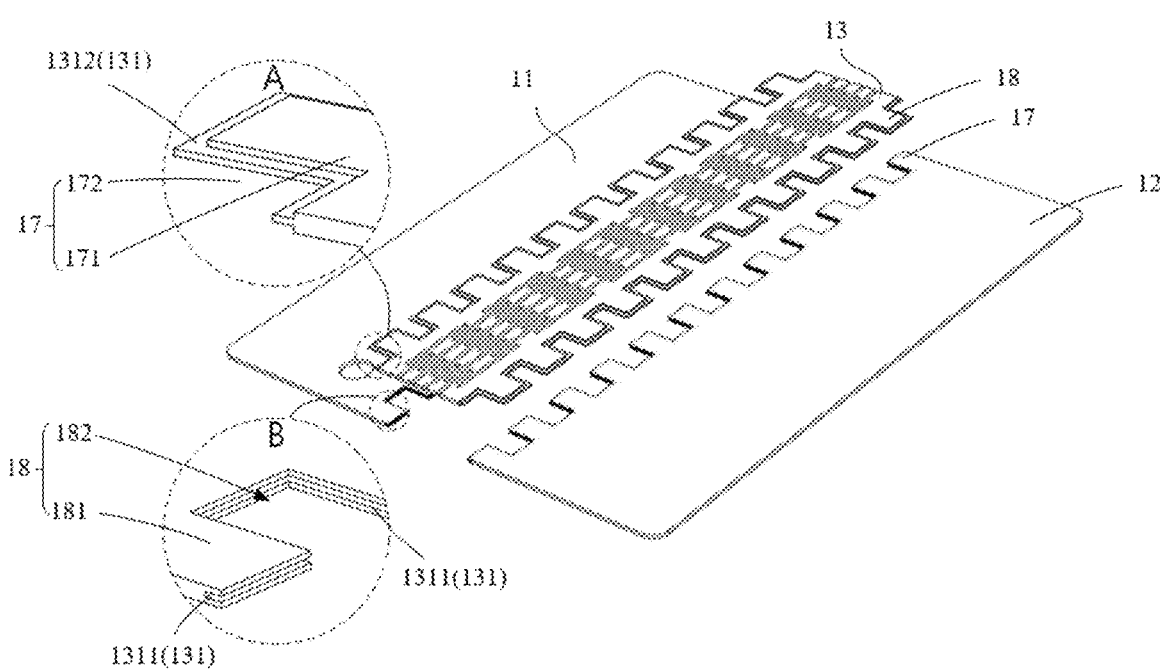
FIG. 8 is a partially exploded view of a combined support layer and partially enlarged views at positions A and B according to a second embodiment of the present disclosure.
Figure 9:
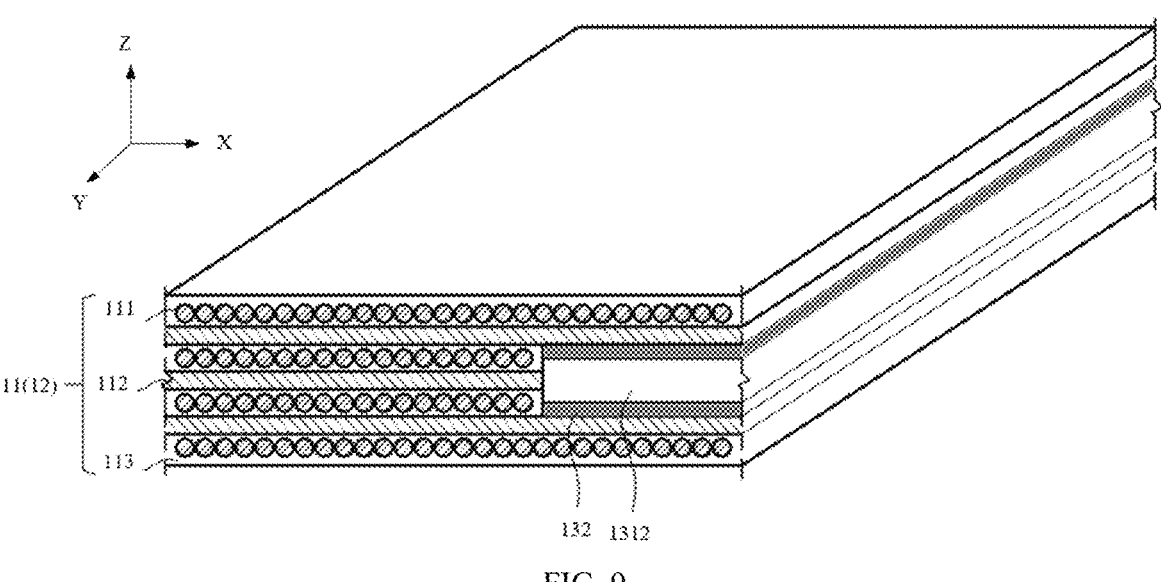
FIG. 9 is a cross-sectional view along VI-VI of the splice of the combined support layer shown in FIG. 7.

Referring to FIGS. 8 to 9, a second embodiment of the present disclosure provides another support structure 130 similar in structure to the support structure 110, except that at the first splicing seam 15 and the second splicing seam 16, the first support element 11 and the second support element 12 are spliced with the third support element 13 using concave-convex butt-insertion structures 131, respectively. Each of the concave-convex butt-insertion structures 131 includes a concave structure 1311 located on one of the first joint portion 17 and the second joint portion 18, and a convex structure 1312 located on the other of the first joint portion 17 and the second joint portion 18. The concave structure 1311 and the convex structure 1312 are bonded to each other by a bonding layer 132. One of the concave structure 1311 and the convex structure 1312 is located on the first support element 11 or the second support element 12, and the other is located on the third support element 13.

The concave-convex butt-insertion structures 131 are spliced with each other to increase the binding area of the metal material with the non-metal material at the first splicing seam 15 and the second splicing seam 16, increase the binding force of the metal material with the non-metal material at the first splicing seam 15 and the second splicing seam 16, and make the splicing of the metal material with the non-metal material at the first splicing seam 15 and the second splicing seam 16 more reliable and robust.

In an alternative embodiment of the present disclosure, the bonding layer 132 is a gel layer. Since the gel layer has good elasticity and plastic deformation capability, the bonding layer 132 can effectively absorb local deformation at the joint of two different materials, thereby avoiding undesirable behavior such as uneven surface of the combined board.

In an embodiment, the convex structure 1312 is located on the first joining portion 17 of the third support element 13, and the concave structure 1311 is located on the second joining portion 18 of the first support element 11 and the second support element 12. In an embodiment, the concave structure 1311 is recessed from the second joining portion 18 toward the inside of the first support element 11 and the second support element 12, and the convex structure 1312 extends from the first joining portion 17 toward the direction away from the third support element 13. Specifically, the convex structure 1312 is integrally formed with the first joining portion 17 to form a step shape. The step formed by the convex structure 1312 and the first joining portion 17 may be formed only on a side facing the planarization layer 20, or on a side away from the planarization layer 20, or on both the side facing the planarization layer 20 and the side away from the planarization layer 20. In an embodiment, the step formed by the convex structure 1312 and the first joining portion 17 is formed on both the side facing the planarization layer 20 and the side away from the planarization layer 20.

Certainly, in other embodiments, the concave structure 1311 and the convex structure 1312 may be located on two sides of the third support element 13, respectively. Accordingly, the convex structure 1312 and the concave structure 1311 are correspondingly formed on the first support element 11 and the second support element 12, respectively, so long as the concave and convex structures on the first joining portion 17 of the first support element 11 and the second joining portion 18 of the third support element 13 corresponding thereto are opposite to each other, and the concave and convex structures of the first joining portion 17 of the second support element 12 and the second joining portion 18 of the third support element 13 corresponding thereto are opposite to each other.

In an embodiment, the first joining portion 17 and the second joining portion 18 have a rectangular shape. Certainly, the shapes of the first convex portions 171 of the first joining portion 17 and the second convex portions 181 of the second joining portion 18 are not limited to the rectangular shape, and may be at least one of a wavy shape, a trapezoidal shape, a sawtooth shape, or the like.

Specifically, referring again to FIG. 9, the first support element 11 and the second support element 12 are made of glass fibers or carbon fibers. The first support element 11 and the second support element 12 each include N+1 first fiber layers 111, N second fiber layers 112, and N+1 resin layers 113. The first fiber layers 111 and the second fiber layers 112 are alternately arranged, and the resin layers 113 are located on the first fiber layers 111 and surround the second fiber layers 112. An included angle between an extension direction of fibers in the first fiber layers 111 and an extension direction of fibers in the second fiber layers 112 is greater than 0° and less than 180°. N is a positive integer greater than 1. In this way, it can ensure the bending strength near the splicing position of the two materials during bending.

The Y axis is the width direction of the display screen 121, the X axis is the length direction of the display screen 121, and the Z axis is the thickness direction of the first support element 11 and the second support element 12. The display screen 121 is rotated about the Y axis when bent.

Referring to FIG. 9, in an embodiment, N=3. That is, each of the first support element 11 and the second support element 12 include four first fiber layers 111, three second fiber layers 112, and four resin layers 113. The thickness of the concave structure 1311 is equal to the total thicknesses of two of the resin layers 113 and one of the first fiber layers 111.

Specifically, referring again to FIG. 9, a bonding layer 132 are formed on the first convex portions 171 or the second convex portions 181. The convex structures 1312 are bonded to the concave structures 1311 by the bonding layer 132. In an embodiment, the bonding layer 132 is made of a gel.

The bonding layer (for example, the gel layer) is applied on the surfaces of the third support element 13 that are respectively in contact with the first support element 11 and the second support element 12, so that the flatness and binding strength at the first splicing seam 15 and the second splicing seam 16 of the entire combined support layer 10 can be ensured. In addition, the gel has good elasticity and plastic deformation capability, and thus can effectively absorb the local deformation at the joint of the two different materials, so as to avoid the undesirable behavior such as unevenness of the surface of the combined support layer.

Certainly, in the first embodiment, in the case that the materials of the first support element 11 and the second support element 12 are selected from the group consisting of glass fibers and carbon fibers, the film structure of each of the first support element 11 and the second support element 12 is the same as that of the film structure according to the embodiments of the present disclosure.

Referring to FIGS. 10 and 11A-11I, the present disclosure further provides a method for manufacturing a display module, including:

Step S1: referring to FIGS. 11A-11E, manufacturing a first support element and a second support element using a non-metallic material.

Figures 11A, 11B, 11C, 11D, 11E, 11F, 11G, 11H, 11I:
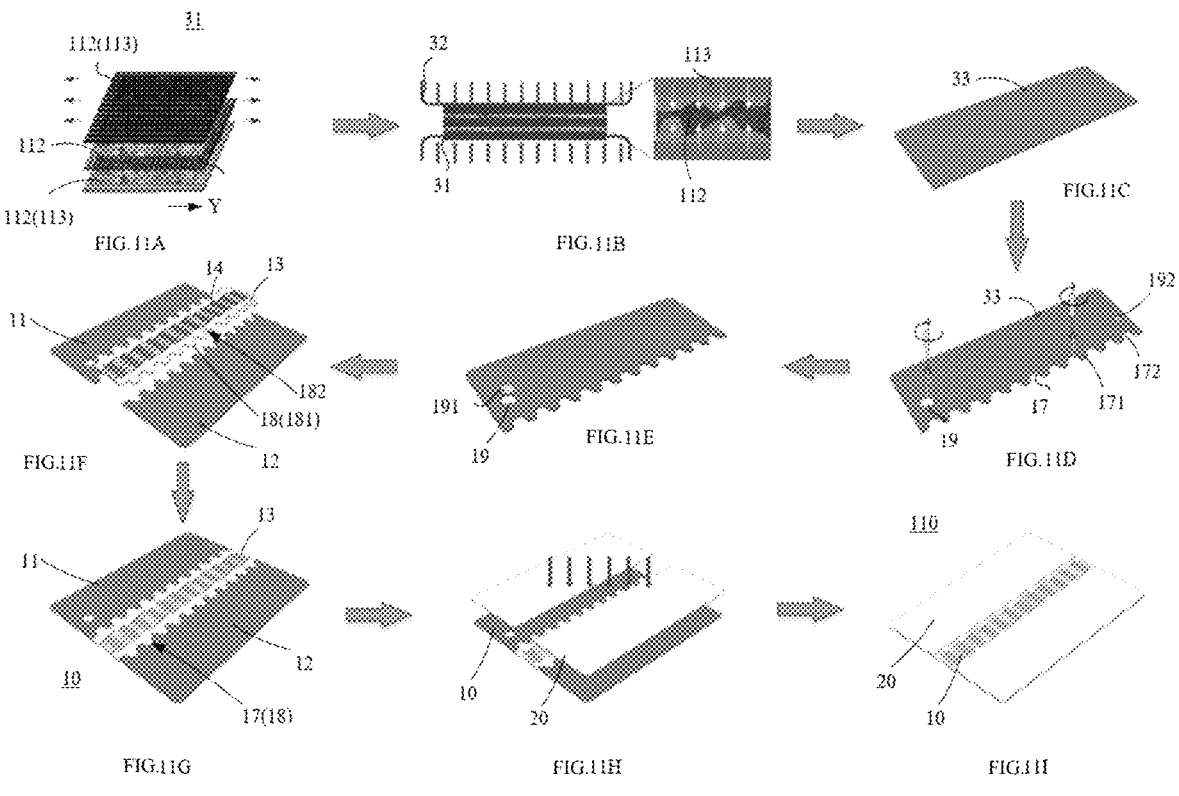
FIGS. 11A-11I are schematic flow charts of a method of manufacturing a support structure according to the present disclosure.

Specifically, the step S1 includes the followings: firstly, referring to FIGS. 9 and 11A, N+1 first fiber layers 111, N second fiber layers 112, and N+1 resin layers 113 are prepared. The second fiber layers 112 and the first fiber layers 111 are alternately laid, and soaked in a resin material such as an epoxy resin or a thermally conductive film material to form the resin layers 113 on the surfaces thereof. The resin layers 113, the second fiber layers 112, and the first fiber layers 111 are pre-pressed to obtain a pre-pressed fiber structure 31. Secondly, referring to FIGS. 11B to 11C, the pre-pressed fiber structure 31 is formed into a fiber sheet 33 by a thermoplastic molding process. Thirdly, referring to FIG. 11D, the fiber sheet 33 is carried out a surface treatment. Fourthly, referring to FIG. 11D, a fingerprint sensor hole 19 and a first joining portion 17 are formed in the surface-treated fiber sheet 33. Fifthly, referring to FIG. 11E, the fingerprint sensor hole 19 is filled with a transparent resin 191, and a surface of the transparent resin 191 is flush with the surface of the fiber sheet 33 around the fingerprint sensor hole 19 by a molding process to obtain the first support element 11 or the second support element 12.

Specifically, before the step that the second fiber layers 112 and the first fiber layers 111 are alternately laid, the method further includes the following step: the second fiber layers 112 and the first fiber layer 111 are pre-drawn.

In an embodiment, N=2.

In an alternative embodiment of the present disclosure, an included angle between an extension direction of fibers in the first fiber layers 111 and an extension direction of fibers in the second fiber layers 112 is greater than 0° and less than 180°. That is, the extension direction of fibers in the first fiber layers 111 is different from the extension direction of fibers in the second fiber layers 112. Specifically, the included angle between the extension direction of fibers in the first fiber layers 111 and the extension direction of fibers in the second fiber layers 112 is 90°.

In an alternative embodiment of the present disclosure, the fibers in the first fiber layers 111 and the second fiber layers 112 have a diameter of 5-8 μm.

In an alternative embodiment of the present disclosure, the first fiber layers 111 and the second fiber layers 112 are made of glass fibers, carbon fibers, or the like.

The pre-pressed fiber structure 31 is placed in a mold 32, and then is carried out a thermoplastic molding process to prepare the fiber sheet 33.

The mold 32 is a mirror precision mold. In the thermoplastic molding process, the pressing temperature is 300° C.-500° C., the pressure is 3 MPa-6 MPa, and the thickness of the fiber sheet 33 is 100 μm-150 μm.

Specifically, the fiber sheet 33 is subjected to a preliminary surface treatment by edge trimming, surface polishing, or the like, so as to remove undesirable defects such as burrs, flashing, and incompletion.

The fingerprint sensor hole 19 is formed by laser drilling or the like, and the first joining portion 17 is formed by laser drilling or trimming. The heat-affected region in the laser processing is controlled in a range of 5 μm or less by controlling parameters such as the laser intensity, the power, and the optical diameter, so as to ensure the processing quality accuracy of the first joining portion 17 at the structural edge.

The fingerprint sensor hole 19 penetrates through the fiber sheet 33.

The first joining portion 17 is located at the side edge of the fiber sheet 33. The first joining portion 17 includes first convex portions 171 and first receiving grooves 172, each of which is formed between adjacent two of the first convex portions 171.

Specifically, referring to FIGS. 2 to 4, in an alternative embodiment of the present disclosure, the first joining portion 17 has a wave shape.

Specifically, referring to FIG. 5, in an alternative embodiment of the present disclosure, the first joining portion 17 has a trapezoidal shape.

Specifically, referring to FIG. 6, in an alternative embodiment of the present disclosure, the first joining portion 17 has a sawtooth shape.

Specifically, referring to FIG. 7, in an alternative embodiment of the present disclosure, the first joining portion 17 has a rectangular shape.

Certainly, in other embodiments, the shape of the first joining portion 17 is not limited to the wave shape, the trapezoidal shape, the rectangular shape, and the sawtooth shape, but may be another shape or a combination of at least two of the wave shape, the trapezoidal shape, the rectangular shape, and the sawtooth shape.

In other embodiments of the present disclosure, referring to FIG. 8, concave structures 1311 and/or convex structures 1312 are formed on the first joining portion 17. The concave structures 1311 are recessed from the first joining portion 17 to the inside of the fiber sheet 33, and the convex structures 1312 extend outwardly from the first joining portion 17.

Step S2: referring to FIG. 11F, forming a third support element 13 using a metal material, forming a hollowed-out structure 14 on the third support element 13. The densities of the first support element 11 and the second support element 12 are less than that of the third support element.

Step S3: referring to FIGS. 11G-11I, splicing the first support element 11 and the second support element 12 with two sides of the third support element 13, respectively, to obtain the support structure 110.

Specifically, the first support element 11 and the second support element 12 are pre-spliced with the third support element 13, respectively, and then a thermoplastic material such as epoxy resin is applied to the splicing positions of the third support element 13 with the first support element 11 and the second support element 12. The first support element 11, the second support element 12 and the third support element 13 are spliced together by a thermoplastic molding process to obtain the combined support layer 10. Then, the combined support layer 10 is cooled. A planarization layer material commonly used in the industry is applied on surfaces of the joints of the combined support layer 10, and then the support structure 110 is obtained by a second thermoplastic molding process.

The first support element 11 and the second support element 12 are located on two sides of the third support element 13, respectively.

The mold is a mirror precision mold. In the thermoplastic molding process, the pressing temperature is 400° C.-500° C., the pressure is 6 MPa-10 MPa, and the cooling time of the combined support layer 10 is 10 minutes or less.

The third support element 13 has a hollowed-out structure 14 at the middle portion, and has a second joining portion 18 at each side. The first joining portion 17 and the second joining portion 18 are inserted and staggered together with each other.

Specifically, the second joining portion 18 includes a plurality of second convex portions 181 and second receiving grooves 182, each of which is formed between adjacent two of the second convex portions 181.

Specifically, referring to FIGS. 2-4, in an alternative embodiment of the present disclosure, the second joining portion 18 has a wave shape.

Specifically, referring to FIG. 5, in an alternative embodiment of the present disclosure, the second joining portion 18 has a trapezoidal shape.

Specifically, referring to FIG. 6, in an alternative embodiment of the present disclosure, the second joining portion 18 has a sawtooth shape.

Specifically, referring to FIG. 7, in an alternative embodiment of the present disclosure, the second joining portion 18 has a rectangular shape.

Certainly, in other embodiments, the shape of the second convex portions 181 is not limited to the wave shape, the trapezoidal shape, the rectangular shape, and the sawtooth shape, but may be another shape or a combination of at least two of the wave shape, the trapezoidal shape, the rectangular shape, and the sawtooth shape.

Referring to FIG. 8, in an alternative embodiment of the present disclosure, concave structures 1311 and/or convex structures 1312 are formed on the second joining portion 18. The concave structures 1311 are recessed from the second joining portion 18 toward the inside of the third support element 13, and the convex structures 1312 extend outwardly from the second joining portion 18.

The convex structures 1312 are housed in the concave structures 1311.

Referring to FIG. 9, in an alternative embodiment of the present disclosure, the concave structures 1311 and the convex structures 1312 are bonded by a bonding layer 132.

An orthographic projection of the planarization layer 20 on the combined support layer 10 is located outside the hollowed-out structure 14.

The thickness of the planarization layer 20 is 5 μm-10 μm.

After the second thermoplastic molding process, the method further includes a step, in which: a protective layer 30 covering the hollowed-out structure 14 is formed on the surface of the combined support layer 10 away from the planarization layer 20.

After or before the formation of the protective layer 30, the method further includes a step of performing surface treatment on the support structure 110, for example, edge trimming, surface polishing, or the like, so as to remove undesirable defects such as burrs, flashing, incompletion, or the like again.

Step S4: referring to FIG. 1, attaching the support structure 110 to a side of the display panel 120 away from a light-emitting side thereof to obtain the display module 100.

The display panel 120 includes a bending region 101, a first non-bending region 102, and a second non-bending region 103. The bending region 101 is located between the first non-bending region 102 and the second non-bending region 103. The first support element 11 is located in the first non-bending region 102, the second support element 12 is located in the second non-bending region 103, and the third support element 13 is located in the bending region 101.

In the support structure and the display module according to the present disclosure, two materials with different densities are used to form the combined support layer, and the density of the third support element is larger than that of the first support element and the second support element. The first support element and the second support element are respectively located in the first non-bending region and the second non-bending region of the display module, and the third support element is located in the bending region of the display module. The present disclosure integrates two materials with different densities, and the first support element and the second support element made of materials with lower densities can reduce the weight of the display module.

In the support structure and the display module according to the present disclosure, the third support element is made of metal, and the first support element and the second support element are made of non-metal, respectively. Thus, the hollowed-out structure of the support structure of the present disclosure is formed on the third support element made of the relatively high-density metal material, rather than on the first support element and the second support element made of the relatively low-density non-metal material, so that the hollowed-out structure can be formed by a chemical etching process without the need to perform the laser processing, thereby reducing the processing cost of the hollowed-out structure, improving the processing efficiency, and in turn reducing the manufacturing cost of the display module.

In addition, by using the thermoplastic material such as epoxy resin to flatten the first splicing seam and the second splicing seam, it is possible to avoid interface cracking due to forces applied on the first splicing seam and the second splicing seam caused by bending stress.

In addition, the first joining portion is inserted and staggered together with the second joining portion, or by the butt-insertion structures, the binding area of the metal material and the non-metal material at the first splicing seam and the second splicing seam is increased, and the binding force of the metal material and the non-metal material at the first splicing seam and the second splicing seam is increased, so that the splicing of the metal material and the non-metal material at the first splicing seam and the second splicing seam is more reliable and robust.

In addition, the planarization layer is formed by applying and hardening the planarization layer material commonly used in the industry to the surfaces of the first splicing seam and the second splicing seam in the second thermoplastic molding process. In this way, it is possible to reduce the risk of creating imprint due to the unevenness of the splicing seams of two different materials when the support structure is attached to other components of the display module.

In addition, the fingerprint sensor hole is disposed on the first or second support element made of the non-metallic material, and filled with the transparent resin, so that the fingerprint recognition technology can be integrated in the folding screen and the risk of transferring the imprint caused by the height difference of the fingerprint sensor hole to the display module can be reduced.

The support structure located in the first non-bending region and the second non-bending region is bonded with the display panel (specifically, with the back plate) using the segmented optical transparent adhesive, so that the local thickness of the bending region of the display module can be reduced to improve the bending stress of the display module in the bending region.

In light of the foregoing, the present disclosure has been illustrated using preferred embodiments, but the above preferred embodiments are not intended to limit the present disclosure, and those of ordinary skill in the art may make various changes and modifications without departing from the spirit and scope of the present disclosure, and therefore the scope of the present disclosure is as defined in the claims.

What is claimed is:

1. A display module, comprising a display panel and a support structure formed on a side of the display panel away from a light-emitting side of the display panel, wherein the display panel is a bendable display panel and comprises a bending region, a first non-bending region, and a second non-bending region, and the bending region is located between the first non-bending region and the second non-bending region; the support structure comprises a combined support layer comprising:

a first support element located in the first non-bending region;

a second support element located in the second non-bending region; and a third support element located between the first support element and the second support element and located in the bending region, wherein the third support element is connected to the first support element and the second support element, and has a hollowed-out structure;

wherein densities of the first support element and the second support element are less than a density of the third support element, wherein the display panel further comprises a display screen, a back plate and an optical adhesive layer, the back plate is located on a back side of the display screen, the optical adhesive layer is located between the back plate and the support structure, and the optical adhesive layer adheres to a planarization layer of the support structure.

2. The display module according to claim 1, wherein the third support element is spliced with the first support element and the second support element at two sides of the third support element;

a first splicing seam is formed between the first support element and the third support element and located in the first non-bending region; and a second splicing seam is formed between the second support element and the third support element and located in the second non-bending region.

3. The display module according to claim 2, wherein the first splicing seam and the second splicing seam have a thermoplastic material therein, and surfaces of the first support element, the second support element, and the third support element are flush with surfaces of the thermoplastic material in the first splicing seam and the second splicing seam.

4. The display module according to claim 2, wherein the planarization layer is formed on a side of the combined support layer close to the display panel and covers the first splicing seam and the second splicing seam.

5. The display module according to claim 4, wherein an orthographic projection of the planarization layer on the combined support layer is disposed outside the hollowed-out structure.

6. The display module according to claim 5, wherein the support structure further comprises a protective layer, which is formed on a surface of the combined support layer away from the planarization layer and covers the first splicing seam, the second splicing seam, and the hollowed-out structure.

7. The display module according to claim 1, wherein the third support element is made of metal, and the first support element and the second support element are made of non-metal.

8. The display module according to claim 2, wherein at the first splicing seam and the second splicing seam, a side of the first support element close to the third support element and a side of the second support element close to the third support element have a first joining portion, respectively; opposite sides of the third support element have a second joining portion, respectively; and the first joining portion is inserted and staggered together with the second joining portion.

9. The display module according to claim 8, wherein the first joining portion comprises a plurality of first convex portions and first receiving grooves, and each of the first receiving grooves is formed between any adjacent two of the first convex portions; the second joining portion comprises a plurality of second convex portions and second receiving grooves, and each of the second receiving grooves is formed between any adjacent two of the second convex portions; the first convex portions are received in the second receiving grooves, and the second convex portions are received in the first receiving grooves.

10. The display module according to claim 9, wherein the first joining portion and the second joining portion have a shape selected from at least one of a wavy shape, a trapezoidal shape, a rectangular shape, and a sawtooth shape.

11. The display module according to claim 8, wherein at the first splicing seam and the second splicing seam, the first support element and the second support element are independently spliced with the third support element using concave-convex butt-insertion structures.

12. The display module according to claim 11, wherein each of the concave-convex butt-insertion structures comprises a concave structure and a convex structure, one of the concave structure and the convex structure is located on the first support element or the second support element, and the other of the concave structure and the convex structure is located on the third support element; the concave structure is recessed from a surface of one of the first joining portion and the second joining portion toward an inside thereof, the convex structure extends outwardly from a surface of the other of the first joining portion and the second joining portion, and the concave structure is bonded to the convex structure by an adhesive layer.

13. The display module according to claim 1, wherein a fingerprint sensor hole is disposed on the first support element or the second support element and filled with a transparent resin, and a surface of the transparent resin is flush with a surface of the first support element or the second support element around the fingerprint sensor hole.

14. The display module according to claim 1, wherein the first support element and the second support element are made of at least one of glass fibers, carbon fibers, and polymeric materials.

15. The display module according to claim 1, wherein the first support element and the second support element are made of glass fibers or carbon fibers; and each of the first support element and the second support element comprises N+1 first fiber layers, N second fiber layers and N+1 resin layers, the first fiber layers and the second fiber layers are alternately arranged, the resin layers are located on the first fiber layers and surround the second fiber layers, and an included angle between an extension direction of fibers in the first fiber layers and an extension direction of fibers in the second fiber layers is greater than 0° and less than 180°, N is a positive integer greater than 1.

16. The display module according to claim 1, wherein the optical adhesive layer comprises a first adhesive segment and a second adhesive segment, the first adhesive segment and the second adhesive segment are located in the first non-bending region and the second non-bending region, respectively, and cover the first splicing seam and the second splicing seam.

17. The display module according to claim 16, wherein the first adhesive segment and the second adhesive segment extend from the first non-bending region and the second non-bending region to the bending region, respectively; and extension lengths of the first adhesive segment and the second adhesive segment in the bending region are 1 mm-2 mm.

18. The display module according to claim 16, wherein the planarization layer comprises a first planarization layer and a second planarization layer, the first planarization layer is located in the first non-bending region, the second planarization layer is located in the second non-bending region, and the first planarization layer and the second planarization layer cover the first splicing seam and the second splicing seam, respectively; and an orthographic projection of the first adhesive segment on the combined support layer is within an orthographic projection of the first planarization layer on the combined support layer, and an orthographic projection of the second adhesive segment on the combined support layer is within an orthographic projection of the second planarization layer on the combined support layer.

19. The display module according to claim 1, wherein the third support element is integrally formed with the first support element and the second support element.

20. A display module, comprising a display panel and a support structure formed on a side of the display panel away from a light-emitting side of the display panel, wherein the support structure comprises a bending region, a first non-bending region, and a second non-bending region, and the bending region is located between the first non-bending region and the second non-bending region, the support structure comprises:

a first support element located in the first non-bending region;

a second support element located in the second non-bending region; and a third support element located between the first support element and the second support element and located in the bending region, wherein the third support element is connected to the first support element and the second support element, and has a hollowed-out structure;

wherein the display panel comprises a display screen, a back plate and an optical adhesive layer, the back plate is located on a back side of the display screen, the optical adhesive layer is located between the back plate and the support structure, and the optical adhesive layer adheres to a planarization layer of the support structure.

* * * * *